(12) United States Patent
Yoshitake et al.

(10) Patent No.: US 9,045,641 B2
(45) Date of Patent: Jun. 2, 2015

(54) CURABLE SILICONE COMPOSITION, CURED PRODUCT THEREOF, AND OPTICAL SEMICONDUCTOR DEVICE

(71) Applicant: Dow Corning Toray Co., Ltd., Tokyo (JP)

(72) Inventors: Makoto Yoshitake, Ichihara (JP); Ryosuke Yamazaki, Ichihara (JP)

(73) Assignee: DOW CORNING TORAY CO., LTD., Chiyoda-Ku, Tokyo (JP)

( * ) Notice: Subject to any disclaimer, the term of this patent is extended or adjusted under 35 U.S.C. 154(b) by 0 days.

(21) Appl. No.: 14/375,977

(22) PCT Filed: Feb. 1, 2013

(86) PCT No.: PCT/JP2013/052965
§ 371 (c)(1),
(2) Date: Jul. 31, 2014

(87) PCT Pub. No.: WO2013/115416
PCT Pub. Date: Aug. 8, 2013

(65) Prior Publication Data
US 2015/0001569 A1    Jan. 1, 2015

(30) Foreign Application Priority Data
Feb. 2, 2012 (JP) ................................. 2012-021280

(51) Int. Cl.
*H01L 33/00* (2010.01)
*C08K 5/549* (2006.01)
(Continued)

(52) U.S. Cl.
CPC . *C08L 83/14* (2013.01); *C08K 3/22* (2013.01); *C08K 3/36* (2013.01); *C08G 77/045* (2013.01);
(Continued)

(58) Field of Classification Search
None
See application file for complete search history.

(56) References Cited

U.S. PATENT DOCUMENTS 5,438,094 A *  8/1995  Fujiki et al. .................... 524/730
6,624,231 B2 *  9/2003  Shiono ........................... 524/492
(Continued)

FOREIGN PATENT DOCUMENTS

| JP | 2009021394 A | 1/2009 |
| JP | 2011140550 A | 7/2011 |

OTHER PUBLICATIONS

English language abstract and machine-assisted English translation for JP2009021394 extracted from espacenet.com database on Oct. 9, 2014, 11 pages.
(Continued)

*Primary Examiner* — Robert S Loewe
(74) *Attorney, Agent, or Firm* — Howard & Howard Attorneys PLLC (57) ABSTRACT

A curable silicone composition comprises: (A) an organopolysiloxane represented by an average unit formula; (B) an organopolysiloxane having 10 or less silicon atoms, wherein 30 to 60 mole % of all silicon atom-bonded organic groups are alkenyl groups having from 2 to 6 carbons; (C) an organopolysiloxane represented by a general formula; (D) an organopolysiloxane having at least 2 silicon atom-bonded hydrogen atoms in a molecule, wherein the content of phenyl groups in all silicon atom-bonded organic groups in this component is 20 to 70 mole %; (E) an organopolysiloxane represented by an average unit formula; (F) a hydrosilylation reaction catalyst; (G) a white pigment; and (H) an inorganic filler other than a white pigment, has excellent formability for forming a cured product that has little discoloration and lowering of mechanical strength by heat and light, has high light reflectance, has excellent dimensional stability, and is capable of good attachment by a sealing agent used for an optical semiconductor device.

7 Claims, 1 Drawing Sheet

(51) Int. Cl.
*C08L 83/14* (2006.01)
*C08G 77/04* (2006.01)
*C08L 83/04* (2006.01)
*H01L 33/60* (2010.01)
*H01L 33/62* (2010.01)
*C08K 3/22* (2006.01)
*C08K 3/36* (2006.01)
*C08G 77/12* (2006.01)
*C08G 77/20* (2006.01)
*C08G 77/38* (2006.01)
*H01L 33/56* (2010.01)
*C08G 77/00* (2006.01)

(52) U.S. Cl.
CPC ................ *C08G 77/12* (2013.01); *C08G 77/20* (2013.01); *C08G 77/38* (2013.01); C08L 83/04 (2013.01); *H01L 33/56* (2013.01); *C08G 77/70* (2013.01); *C08G 77/80* (2013.01); *C08L 2205/02* (2013.01); *H01L 2224/32245* (2013.01); *H01L 2224/48091* (2013.01); *H01L 2224/48247* (2013.01); *H01L 2224/73265* (2013.01); H01L 33/60 (2013.01); H01L 33/62 (2013.01)

(56) References Cited

U.S. PATENT DOCUMENTS

| | | | |
|---|---|---|---|
| 2005/0209400 A1* | 9/2005 | Tsumura et al. | 525/100 |
| 2005/0256259 A1* | 11/2005 | Goto et al. | 524/588 |
| 2007/0219312 A1* | 9/2007 | David | 524/588 |
| 2008/0057325 A1* | 3/2008 | Sakurai et al. | 428/447 |
| 2008/0220266 A1* | 9/2008 | Murai et al. | 428/447 |
| 2008/0254247 A1* | 10/2008 | Asaine | 428/40.9 |
| 2009/0118440 A1 | 5/2009 | Nakanishi et al. | |
| 2009/0121180 A1* | 5/2009 | Tsubokawa et al. | 252/182.3 |
| 2009/0123764 A1* | 5/2009 | Morita et al. | 428/446 |
| 2009/0258216 A1* | 10/2009 | Yamakawa et al. | 428/323 |
| 2011/0024675 A1* | 2/2011 | Endo et al. | 252/78.3 |
| 2011/0160410 A1 | 6/2011 | Sagawa et al. | |
| 2011/0188213 A1* | 8/2011 | Domae et al. | 361/748 |

OTHER PUBLICATIONS

English language abstract and machine-assisted English translation for JP2011140550 extracted from espacenet.com database on Oct. 9, 2014, 17 pages.

International Search Report for PCT/JP2013/052965 dated Jun. 7, 2013, 4 pages.

* cited by examiner

CURABLE SILICONE COMPOSITION, CURED PRODUCT THEREOF, AND OPTICAL SEMICONDUCTOR DEVICE

CROSS-REFERENCE TO RELATED APPLICATIONS

This application is the National Stage of International Patent Application No. PCT/JP2013/052965, filed on Feb. 1, 2013, which claims priority to and all the advantages of Japanese Patent Application No. 2012-021280, filed on Feb. 2, 2012, the content of which is incorporated herein by reference.

TECHNICAL FIELD

The present invention relates to a curable silicone composition, cured product thereof, and to an optical semiconductor device using the cured product as a light reflection material.

BACKGROUND ART

Curable silicone compositions that cure by a hydrosilylation reaction are used as protective agents, coating agents, lens-molding materials, light reflection materials, or the like for optical semiconductor elements in optical semiconductor devices such as photocouplers, light emitting diodes, solid-state imaging devices, or the like. Among these, the compositions used as light reflection materials can be exemplified by a resin composition for a mounting package that incorporates an optical semiconductor element, and comprises a thermosetting type addition reaction-capable silicone resin that has a structure where vinyl groups or allyl groups, and hydrogen atoms are directly bonded to silicon atoms, a platinum-type catalyst as a curing catalyst, and a white pigment (refer to Japanese Unexamined Patent Application Publication No. 2009-21394); and by an addition curable silicone resin composition comprises a vinyl-functional organopolysiloxane having a weight average molecular weight (Mw) greater than or equal to 30,000, an organohydrogenpolysiloxane having at least two silicon atom-bonded hydrogen atoms in a molecule, a white pigment; an inorganic filler other than the white pigment, a platinum metal-type catalyst; and a reaction inhibitor, wherein its cured product has a visible light average reflectance greater than or equal to 80% (refer to Japanese Unexamined Patent Application Publication No. 2011-140550).

These compositions have the following problems in transfer molding, injection molding, or compression molding: low mold filling, facile generation of voids and flashing, and/or a poor mold releasability; also, slow curing rate and a poor workability in the molding operation. In addition, although the cured products obtained by curing these compositions have the advantage of little discoloration by heat and light, the cured products have following problems of high linear expansion coefficients and/or a low mechanical strength at high temperature, as well as the problems of an insufficient light reflectance and great lowering of mechanical strength by heat or light. When such a composition is used to form a light reflection material in an optical semiconductor device in contact with a lead frame, adhesion to the lead frame is poor.

An object of the present invention is to provide a curable silicone composition that has excellent formability and forms a cured product that has little discoloration and lowering of mechanical strength by heat and light, has high light reflectance, and has excellent dimensional stability. A further object of the present invention is to provide a cured product that has little discoloration and lowering of mechanical strength by heat and light, and has high light reflectance. A further object of the present invention is to provide an optical semiconductor device that has a light reflector material that bonds readily to the lead frame.

DISCLOSURE OF INVENTION

A curable silicone composition of the present invention characteristically comprises:

(A) 100 parts by mass of an organopolysiloxane represented by the following average unit formula:

$$(R^1{}_3SiO_{1/2})_a(R^1{}_2SiO_{2/2})_b(R^1SiO_{3/2})_c(SiO_{4/2})_d(R^2O_{1/2})_e$$

wherein $R^1$ are the same or different, and are phenyl groups, alkyl groups having from 1 to 6 carbons, or alkenyl groups having from 2 to 6 carbons, provided that 30 to 80 mole % of all $R^1$ are phenyl groups, and 5 to 20 mole % of all $R^1$ are alkenyl groups; $R^2$ is a hydrogen atom or alkyl group having from 1 to 6 carbons; and "a", "b", "c", "d", and "e" are numbers that respectively satisfy: $0 \le a \le 0.3$, $0 \le b \le 0.7$, $0.3 \le c \le 0.9$, $0 \le d \le 0.1$, $0 \le e \le 0.1$, and $a+b+c+d=1$;

(B) 5 to 50 parts by mass of an organopolysiloxane having 10 or less silicon atoms and not having a glycidoxyalkyl group or epoxycyclohexyl alkyl group, wherein 30 to 60 mole % of all silicon atom-bonded organic groups in this component are alkenyl groups having from 2 to 6 carbons;

(C) 0 to 40 parts by mass of an organopolysiloxane represented by the following general formula:

$$R^3{}_3SiO(R^3{}_2SiO)_mSiR^3{}_3$$

wherein $R^3$ are the same or different, and are phenyl groups, alkyl groups having from 1 to 6 carbons, or alkenyl groups having from 2 to 6 carbons, provided that 30 to 70 mole % of all $R^3$ are phenyl groups, and at least one $R^3$ is an alkenyl group; and "m" is an integer in a range from 10 to 100;

(D) an organopolysiloxane having at least 2 silicon atom-bonded hydrogen atoms in a molecule, wherein 20 to 70 mol % of all silicon atom-bonded organic groups in this component are phenyl groups, in an amount that provides 0.5 to 2.0 moles of the silicon atom-bonded hydrogen atoms in this component per 1 mole of the total amount of alkenyl groups in components (A) to (C) and component (E);

(E) an organopolysiloxane represented by the following average unit formula:

$$(R^4{}_3SiO_{1/2})_f(R^4{}_2SiO_{2/2})_g(R^4SiO_{3/2})_h(SiO_{4/2})_i(R^5O_{1/2})_j$$

wherein $R^4$ are the same or different, and are phenyl groups, alkyl groups having from 1 to 6 carbons, alkenyl groups having from 2 to 6 carbons, glycidoxyalkyl groups, or epoxycyclohexyl alkyl groups, provided that 15 to 60 mole % of all $R^4$ are phenyl groups, 3 to 30 mole % of all $R^4$ are alkenyl groups, and 5 to 30 mole % of all $R^4$ are glycidoxyalkyl groups or epoxycyclohexyl alkyl groups; $R^5$ is a hydrogen atom or an alkyl group having from 1 to 6 carbons; and "f", "g", "h", "i", and "j" are numbers that respectively satisfy: $0 \le f \le 0.5$, $0 \le g \le 0.9$, $0 \le h \le 0.7$, $0 \le i \le 0.3$, $0 \le j \le 0.02$, and $f+g+h+i=1$, in an amount of 0.5 to 5.0 parts by mass per 100 parts by mass of the total amount of components (A) to (D);

(F) a hydrosilylation reaction catalyst in an amount sufficient to accelerate a hydrosilylation reaction between the alkenyl groups in components (A) to (C) and component (E) and the silicon atom-bonded hydrogen atoms in component (D);

(G) a white pigment in an amount of at least 25 parts by mass per 100 parts by mass of the total amount of components (A) to (F); and (H) an inorganic filler other than a white pigment in an amount of at least 40 parts by mass per 100 parts by mass of the total amount of components (A) to (F), wherein the content of the total amount of components (G) and (H) is not more than 300 parts by mass per 100 parts by mass of the total amount of components (A) to (F).

Moreover, the cured product of the present invention is characteristically provided by curing the aforementioned curable silicone composition.

Furthermore, an optical semiconductor device of the present invention is characterized in comprising: an optical semiconductor element, a lead frame for electrical connection to the element, and a light reflection material, contacting the lead frame, for reflection of light emitted from the element; wherein the light reflection material is formed by a cured product of the curable silicone composition.

Effects of Invention

The curable silicone composition of the present invention has excellent formability and upon curing characteristically forms a cured product that exhibits little discoloration or lowering of mechanical strength by heat or light, and that has high light reflectance and excellent dimensional stability. Moreover, the cured product of the present invention has little discoloration or lowering of mechanical strength by heat or light and has high light reflectance. Furthermore, in the optical semiconductor device of the present invention, the light reflection material adheres well to the lead frame.

DETAILED DESCRIPTION OF THE INVENTION

Firstly, the curable silicone composition of the present invention will be explained in detail.

Component (A) is the main component of the present composition and is an organopolysiloxane represented by the following average unit formula:

$(R^1{}_3SiO_{1/2})_a(R^1{}_2SiO_{2/2})_b(R^1SiO_{3/2})_c(SiO_{4/2})_d(R^2O_{1/2})_e$

In the formula, $R^1$ are the same or different, and are phenyl groups, alkyl groups having from 1 to 6 carbons, or alkenyl groups having from 2 to 6 carbons. Examples of the alkyl group of $R^1$ include methyl groups, ethyl groups, propyl groups, butyl groups, pentyl groups, hexyl groups, cyclopentyl groups, and cyclohexyl groups. Examples of the alkenyl group of $R^1$ include vinyl groups, allyl groups, butenyl groups, pentenyl groups, and hexenyl groups. In the formula, the content of phenyl groups in all $R^1$ is in a range from 30 to 80 mole %, and is preferably in a range from 40 to 70 mole %. When the content of phenyl groups is greater than or equal to the lower limit of the aforementioned range, mechanical strength of the obtained cured product is good. On the other hand, when the content of phenyl groups is less than or equal to the aforementioned upper limit, hardness of the obtained cured product is good at high temperature. Moreover, the content of alkenyl groups in all $R^1$ in the formula is in a range from 5 to 20 mole %. When the content of alkenyl groups is greater than or equal to the lower limit of the aforementioned range, hardness of the obtained cured product at room temperature is good. On the other hand, when the content of alkenyl groups is less than or equal to the upper limit of the aforementioned range, mechanical strength of the obtained cured product is good.

Moreover, $R^2$ in the formula is a hydrogen atom or alkyl group having from 1 to 6 carbons. Examples of the alkyl group of $R^2$ include methyl groups, ethyl groups, propyl groups, butyl groups, pentyl groups, and hexyl groups.

Moreover, in the formula, "a" is a number indicating the fraction of siloxane units represented by the general formula: $R^1{}_3SiO_{1/2}$, and is a number satisfying: $0 \leq a \leq 0.3$, and preferably $0 \leq a \leq 0.25$. When the value of "a" is less than or equal to the aforementioned upper limit, hardness of the obtained cured product at room temperature is good. Moreover, "b" is a number indicating the fraction of siloxane units represented by the general formula: $R^1{}_2SiO_{2/2}$, and is a number satisfying: $0 \leq b \leq 0.7$, and preferably $0 \leq a \leq 0.6$. When the value of "b" is less than or equal to the aforementioned upper limit, hardness of the obtained cured product at room temperature is good. Moreover, "c" is a number indicating the fraction of siloxane units represented by the general formula: $R^1SiO_{3/2}$, and is a number satisfying: $0.3 \leq c \leq 0.9$, and preferably: $0.35 \leq c \leq 0.85$. When the value of "c" is greater than or equal to the lower limit of the aforementioned range, hardness of the obtained cured product at room temperature is good. On the other hand, when the value of "c" is less than or equal to the upper limit of the aforementioned range, mechanical strength of the obtained cured product is good. Moreover, "d" is a number indicating the fraction of siloxane units represented by the general formula: $SiO_{4/2}$, and is a number satisfying: $0 \leq d \leq 0.1$. When the value of "d" is less than or equal to the upper limit of the aforementioned range, mechanical strength of the obtained cured product is good. Moreover, "e" is a number indicating the fraction of units represented by the general formula: $R^2O_{1/2}$, and is a number satisfying: $0 \leq e \leq 0.1$. When the value of "e" is less than or equal to the aforementioned upper limit, hardness of the obtained cured product at room temperature is good. Furthermore, the sum of "a", "b", "c", and "d" in the formula is 1.

Component (B) is a component used for improving handling and processability of the present composition and adjusting hardness of the obtained cured product. Component (B) is an organopolysiloxane having 10 or less silicon atoms and not having a glycidoxyalkyl group or epoxycyclohexyl alkyl group, wherein 30 to 60 mole % of all silicon atom-bonded organic groups in this component are alkenyl groups having from 2 to 6 carbons. Examples of the alkenyl groups in component (B) include vinyl groups, allyl groups, butenyl groups, pentenyl groups, and hexenyl groups. Although no particular limitation is placed on the silicon-bonded organic group other than the alkenyl groups in component (B), this group is exemplified by the methyl group and phenyl group, and preferably is the methyl group. 30 to 60 mole % of all silicon atom-bonded organic groups in component (B) are alkenyl groups having from 2 to 6 carbons. When the content of alkenyl groups is greater than or equal to the lower limit of the aforementioned range, hardness of the obtained cured product is good. On the other hand, when the content of alkenyl groups is less than or equal to the upper limit of the aforementioned range, mechanical strength of the obtained cured product is good. Furthermore, the number of silicon atoms is less than or equal to 10. This is because viscosity of the composition is good when the number of silicon atoms is less than or equal to 10.

Examples of component (B) include 1,3,5,7-tetramethyl-1,3,5,7-tetravinylcyclotetrasiloxane, tetrakis(dimethylvinylsiloxy)silane, methyltris(dimethylvinylsiloxy)silane, and phenyltris(dimethylvinylsiloxy)silane.

The content of component (B) in the present composition, per 100 parts by mass of component (A), is in a range from 5 to 50 parts by mass, and is preferably in a range from 5 to 40 parts by mass. When the content of component (B) is greater than or equal to the lower limit of the aforementioned range, viscosity of the composition is good. On the other hand, when the content of component (B) is less than or equal to the upper limit of the aforementioned range, mechanical strength of the obtained cured product is good.

Component (C) is an optional component for adjusting viscosity of the present composition and for adjusting hardness and mechanical strength of the obtained cured product. Component (C) is an organopolysiloxane represented by the following general formula:

$R^3_3SiO(R^3_2SiO)_mSiR^3_3$

In the formula, $R^3$ are the same or different, and are phenyl groups, alkyl groups having from 1 to 6 carbons, or alkenyl groups having from 2 to 6 carbons. Examples of the alkyl group of $R^3$ include methyl groups, ethyl groups, propyl groups, butyl groups, pentyl groups, hexyl groups, cyclopentyl groups, and cyclohexyl groups. Examples of the alkenyl group of $R^3$ include vinyl groups, allyl groups, butenyl groups, pentenyl groups, and hexenyl groups. In the formula, the content of phenyl groups in all $R^3$ is in a range from 30 to 70 mole %, and is preferably in a range from 40 to 60 mole %. When the content of phenyl groups is greater than or equal to the lower limit of the aforementioned range, mechanical strength of the obtained cured product is good. On the other hand, when the content of phenyl groups is greater than or equal to the aforementioned upper limit, hardness of the obtained cured product is good. Moreover, at least one $R^3$ is an alkenyl group. This component participates in the curing reaction when this component has at least one alkenyl group.

In the formula, "m" is an integer in a range from 10 to 100, and is preferably an integer in a range from 10 to 50. When "m" is greater than or equal to the lower limit of the aforementioned range, mechanical strength of the obtained cured product is good. On the other hand, when "m" is less than or equal to the upper limit of the aforementioned range, handling and processability of the obtained composition is good.

The content of component (C) in the present composition, per 100 parts by mass of component (A), is in a range from 0 to 40 parts by mass, and is preferably in a range from 0 to 20 parts by mass. When the content of component (C) is less than or equal to the aforementioned upper limit, hardness of the obtained cured product is good.

Component (D) is a crosslinking agent of the present composition, and is an organopolysiloxane having at least 2 silicon atom-bonded hydrogen atoms in a molecule, wherein 20 to 70 mole % of all silicon atom-bonded organic groups in component (D) are phenyl groups. The number of the silicon atom-bonded hydrogen atoms in a molecule in component (D) is greater than or equal to 2. If this number of the silicon atom-bonded hydrogen atoms is present, crosslinking for curing is sufficient, and hardness of the obtained cured product is good. Examples of the silicon-bonded organic group in component (D) include a monovalent hydrocarbon group having no unsaturated aliphatic bond, as exemplified by an alkyl group such as a methyl group, ethyl group, propyl group, butyl group, pentyl group, hexyl group, heptyl group, cyclopentyl group, cyclohexyl group, cycloheptyl group, and the like; an aryl group such as a phenyl group, tolyl group, xylyl group, and the like; and an aralkyl group such as a benzyl group, phenethyl group, and the like. Of these, a phenyl group and an alkyl group having from 1 to 6 carbons are preferred. In component (D), 20 to 70 mole % of all silicon atom-bonded organic groups are phenyl groups. When the content of phenyl groups is greater than or equal to the lower limit of the aforementioned range, mechanical strength of the obtained cured product at high temperature is good. On the other hand, when the content of phenyl groups is less than or equal to the aforementioned upper limit, mechanical strength of the obtained cured product is good.

Examples of component (D) include an organotrisiloxane represented by the following general formula:

$(HR^6_2SiO)_2SiR^6_2$ a linear chain organopolysiloxane represented by the following general formula:

$R^7_3SiO(R^7_2SiO)_nSiR^7_3$ and a branched chain organopolysiloxane represented by the following average unit formula:

$(R^7SiO_{3/2})_p(R^7_2SiO_{2/2})_q(R^7_3SiO_{1/2})_r(SiO_{4/2})_s(XO_{1/2})_t$

In the formula, $R^6$ are the same or different, and are phenyl groups or alkyl groups having from 1 to 6 carbons. Examples of the alkyl group of $R^6$ include methyl groups, ethyl groups, propyl groups, butyl groups, pentyl groups, hexyl groups, cyclopentyl groups, and cyclohexyl groups. The content of phenyl groups in all $R^6$ is in a range from 30 to 70 mole %.

In the formula, $R^7$ are the same or different, and are hydrogen atoms, phenyl groups, or alkyl groups having from 1 to 6 carbons. At least two $R^7$ in the formula are hydrogen atoms. Examples of the alkyl group of $R^7$ include methyl groups, ethyl groups, propyl groups, butyl groups, pentyl groups, hexyl groups, cyclopentyl groups, and cyclohexyl groups. The content of phenyl groups in all $R^7$ except hydrogen atoms is in a range from 30 to 70 mole %.

In the formula, "n" is an integer in a range from 5 to 1,000. In the formula, "p" is a positive number, "q" is 0 or a positive number, "r" is 0 or a positive number, "s" is 0 or a positive number, and "t" is 0 or a positive number. Also, the ratio "q/p" is a number in a range from 0 to 10. The ratio "r/p" is a number in a range from 0 to 5. The ratio "s/(p+q+r+s)" is a number in a range from 0 to 0.3. The ratio "t/(p+q+r+s)" is a number in a range from 0 to 0.4.

All of component (D) or the main component of component (D) is preferably an organotrisiloxane represented by the following general formula:

$(HR^6_2SiO)_2SiR^6_2$

The content of this organotrisiloxane in component (D) is preferably at least 50% by mass.

The content of component (D) in the present composition is an amount such that the amount of silicon atom-bonded hydrogen atoms in this component, per 1 mole of the total amount of alkenyl groups in components (A) to (C) and component (E), is from 0.5 to 2.0 moles, and is preferably from 0.5 to 1.5 moles. When the content of component (D) is within the aforementioned range, hardness of the obtained cured product is good.

Component (E) is an adhesion promoter of the present composition and is an organopolysiloxane represented by the average unit formula:

$(R^4_3SiO_{1/2})_f(R^4_2SiO_{2/2})_g(R^4SiO_{3/2})_h(SiO_{4/2})_i(R^5O_{1/2})_j$

In the formula, $R^4$ are the same or different, and are phenyl groups, alkyl groups having from 1 to 6 carbons, alkenyl groups having from 2 to 6 carbons, glycidoxyalkyl groups, or epoxycyclohexyl alkyl groups. Examples of the alkyl group of $R^4$ include methyl groups, ethyl groups, propyl groups, butyl groups, pentyl groups, hexyl groups, cyclopentyl groups, and cyclohexyl groups. Examples of the alkenyl group of $R^4$ include vinyl groups, allyl groups, butenyl groups, pentenyl groups, and hexenyl groups. Examples of the glycidoxyalkyl group of $R^4$ include 3-glycidoxypropyl groups and 4-glycidoxybutyl groups. Examples of the epoxycyclohexyl alkyl group of $R^4$ include 2-(3,4-epoxycyclohexyl)ethyl groups and 3-(3,4-epoxycyclohexyl)propyl groups. In the formula, the content of phenyl groups in all $R^4$ is in a range from 15 to 60 mole %, and is preferably in a range from 20 to 50 mole %. When the content of phenyl groups is greater than or equal to the lower limit of the aforementioned range, adhesion and reflectance of the obtained cured product is good. When the content of phenyl groups is less than or equal to the aforementioned upper limit, adhesion and heat resistance properties of the obtained cured product is good. In the formula, the content of alkenyl groups in all $R^4$ is in a range from 3 to 30 mole %, and is preferably in a range from 5 to 20 mole %. When the content of alkenyl groups is within the aforementioned range, adhesion of the obtained cured product is good. Also, the content of glycidoxyalkyl groups or epoxycyclohexylalkyl groups in all $R^4$ is in a range from 5 to 30 mole %, and is preferably in a range from 10 to 20 mole %. When the content of epoxy group-containing organic groups is greater than or equal to the lower limit of the aforementioned range, adhesion of the obtained cured product to metal is good. When the content of epoxy group-containing organic groups is less than or equal to the aforementioned upper limit, heat resistance properties is good.

Moreover, $R^5$ in the formula is a hydrogen atom or alkyl group having from 1 to 6 carbons. Examples of the alkyl group of $R^5$ include methyl groups, ethyl groups, butyl groups, pentyl groups, and hexyl groups.

Moreover, in the formula, "f" is a number indicating the fraction of siloxane units represented by the general formula: $R^4_3SiO_{1/2}$, and is a number satisfying: $0 \leq f \leq 0.5$, and preferably $0 \leq f \leq 0.4$. When "f" is less than or equal to the upper limit of the aforementioned range, adhesion of the obtained cured product is good. Moreover, in the formula, "g" is a number indicating the fraction of siloxane units represented by the general formula: $R^4_2SiO_{2/2}$, and is a number satisfying: $0 \leq g \leq 0.9$, and preferably $0 \leq g \leq 0.8$. When "g" is less than or equal to the upper limit of the aforementioned range, adhesion of the obtained cured product is good. Moreover, "h" is a number indicating the fraction of siloxane units represented by the general formula: $R^4SiO_{3/2}$, and is a number satisfying: $0 \leq h \leq 0.7$, and preferably $0 \leq h \leq 0.6$. When "h" is less than or equal to the upper limit of the aforementioned range, adhesion of the obtained cured product is good. Moreover, "i" is a number indicating the fraction of siloxane units represented by the general formula: $SiO_{4/2}$, and is a number satisfying: $0 \leq i \leq 0.3$, and preferably $0 \leq i \leq 0.2$. When "i" is less than or equal to the upper limit of the aforementioned range, adhesion of the obtained cured product is good. Moreover, "j" is a number indicating the fraction of units represented by the general formula: $R^5O_{1/2}$, and is a number satisfying: $0 \leq j \leq 0.02$. When "j" is less than or equal to the upper limit of the aforementioned range, storage stability and usable life of the present composition are good. Furthermore, the sum of "f", "g", "h", and "i" in the formula is 1.

The content of component (E) in the present composition, per 100 parts by mass of the total amount of components (A) to (D), is in a range from 0.5 to 5.0 parts by mass, and is preferably in a range from 1.0 to 3.0 parts by mass. When the content of component (E) is less than or equal to the upper limit of the aforementioned range, heat resistance properties of the obtained cured product is good. When the content of component (E) is greater than or equal to the lower limit of the aforementioned range, adhesion of the obtained cured product is good.

Component (F) is a hydrosilylation reaction catalyst for accelerating the hydrosilylation reaction between the alkenyl groups in components (A) to (C) and component (E) and the silicon atom-bonded hydrogen atoms in component (D). Examples of component (F) include platinum-type catalysts, rhodium-type catalysts, and palladium-type catalysts. Platinum-type catalysts are preferred due to the ability to remarkably accelerate curing of the composition. Examples of the platinum-type catalysts include platinum fine powder, chloroplatinic acid, alcoholic solutions of chloroplatinic acid, platinum-alkenylsiloxane complexes, platinum-olefin complexes, and platinum-carbonyl complexes., Platinum-alkenylsiloxane complexes are particularly preferred. Examples of the alkenylsiloxane include 1,3-divinyl-1,1,3,3-tetramethyldisiloxane, 1,3,5,7-tetramethyl-1,3,5,7-tetravinyl cyclotetrasiloxane, alkenylsiloxanes having part of the methyl groups of these alkenylsiloxane substituted by ethyl groups, phenyl groups, or the like, and alkenylsiloxanes having vinyl groups of these alkenylsiloxane substituted by allyl groups, hexenyl groups, or the like. 1,3-divinyl-1,1,3,3-tetramethyldisiloxane is particularly preferred due to high stability of the platinum-alkenylsiloxane complex. Due to the ability for improving the stability of the platinum-alkenylsiloxane complexes, combination is recommended of the platinum-alkenylsiloxane complexes with organosiloxane oligomers such as 1,3-divinyl-1,1,3,3-tetramethyldisiloxane, 1,3-diallyl-1,1,3,3-tetramethyldisiloxane, 1,3-divinyl-1,3-dimethyl-1,3-diphenyldisiloxane, 1,3-divinyl-1,1,3,3-tetraphenyldisiloxane, 1,3,5,7-tetramethyl-1,3,5,7-tetravinyl cyclotetrasiloxane, or the like alkenylsiloxane, or dimethylsiloxane oligomers. The addition of alkenylsiloxanes is particularly preferred.

No particular limitation is placed on the content of component (F) in the composition as long as there is an amount sufficient to accelerate the hydrosilylation reaction between the alkenyl groups in components (A) to (C) and component (E) and the silicon atom-bonded hydrogen atoms in component (D). However, this concentration in the present composition, in terms of mass units, the content of the metal atoms in the component (F), is preferably from 0.01 to 500 ppm, further preferably is from 0.01 to 100 ppm, and particularly preferably is from 0.01 to 50 ppm. When the content of component (F) is greater than or equal to the lower limit of the aforementioned range, the obtained composition exhibits an excellent cure. On the other hand, when the content of component (F) is less than or equal to the upper limit of the aforementioned range, the obtained cured product is resistant to discoloration.

Component (G) is a white pigment for coloring the cured product and composition of the present invention white and for increasing light reflectance. Preferred examples of the component (G) include metal oxides such as titanium oxide, alumina, zinc oxide, zirconium oxide, magnesium oxide, and the like; barium sulfate, zinc sulfate, or the like; and titanium oxide and zinc oxide are particularly preferred.

Although no particular limitation is placed on the shape and the average particle diameter of component (G), the average particle diameter is preferably in a range from 0.05 to 10.0 μm, and further is preferably in a range from 0.1 to 5.0 μm. In order to increase the compatibility and dispersion ability of the white pigment with the resin and inorganic filler, the white pigment may be surface-treated using a silane coupling agent, silica, alumina, or the like.

The content of component (G) in the present composition, per 100 parts by mass of the total amount of components (A) to (F), is greater than or equal to 25 parts by mass, and is preferably greater than or equal to 30 parts by mass. Light reflectance of the cured product is good when the content of component (G) is greater than or equal to the lower limit of the aforementioned range.

Component (H) is an inorganic filler other than a white pigment for decreasing linear expansion coefficient of the cured product of the present invention, for improvement of dimensional stability, and for imparting appropriate viscosity to the composition. The inorganic filler of component (H) is exemplified by spherical silica, non-spherical silica, glass fiber, mica, and calcium carbonate. Examples of the spherical silica include dry-process silica, precipitated silica, fused silica, and pyrogenic silica. Examples of the spherical silica include quartz powder and glass beads. Examples of the glass fiber include chopped glass fibers and milled glass fibers.

Although no particular limitation is placed on average particle diameter of the inorganic filler of component (H), in the case of spheres, the average particle diameter is preferably in a range from 0.1 to 20 μm, and further preferably is in a range from 0.5 to 10 μm. In the case of fibers, fiber diameter is preferably in a range from 1 to 50 μm, and further preferably is in a range from 5 to 20 μm. Fiber length is preferably in a range from 5 to 500 μm, and further preferably is in a range from 10 to 300 μm.

The content of component (H) in the present composition, per 100 parts by mass of the total amount of components (A) to (F), is greater than or equal to 40 parts by mass, and is preferably greater than or equal to 50 parts by mass. Linear expansion coefficient of the obtained cured product is low and dimensional stability is good when the content of component (H) is greater than or equal to the lower limit of the aforementioned range.

The total content of components (G) and (H) in the present composition, per 100 parts by mass of the total amount of components (A) to (F), is less than or equal to 300 parts by mass, and is preferably less than or equal to 250 parts by mass. Viscosity of the obtained composition is good when the total content of components (G) and (H) is less than or equal to the aforementioned upper limit.

Although the aforementioned components (A) to (H) are essential components of the present composition, other optional components include a reaction inhibitor, for example, alkyne alcohols such as 1-ethynyl-1-cyclohexanol, 2-methyl-3-butyn-2-ol, 3,5-dimethyl-1-hexyn-3-ol, 2-phenyl-3-butyn-2-ol, and the like; eneyne compounds such as 3-methyl-3-penten-1-yne, 3,5-dimethyl-3-hexen-1-yne, and the like; and 1,3,5,7-tetramethyl-1,3,5,7-tetravinylcyclotetrasiloxane, 1,3,5,7-tetramethyl-1,3,5,7-tetrahexenylcyclotetrasiloxane, benzotriazole, and the like. Although no limitation is placed on the content of this reaction inhibitor, the content in the present composition, in terms of mass units, is preferably in a range from 1 to 5,000 ppm.

As long as the object of the present invention is not impaired, other optional components may be included in the present composition. Such other optional components include organic resin powders of polymethacrylate resins, silicone resins, or the like; carnauba wax, metal stearate salts, methyl silicone oils, or the like mold release agents; and thermal stabilizers, flame retardants, solvents, or the like.

Although no particular limitation is placed on the viscosity of the present composition at 25° C., the viscosity is preferably in a range from 2 to 200 Pa·s, further is preferably in a range from 3 to 120 Pa·s, and particularly is preferably in a range from 5 to 80 Pa·s. The occurrence of flashing in the obtained molded article is suppressed when the viscosity is greater than or equal to the lower limit of the aforementioned range. Handling and processability of the obtained composition is good when viscosity is less than or equal to the upper limit of the aforementioned range.

Although no particular limitation is placed on the hardness of the cured product of the present invention, type D durometer hardness as specified by JIS K 7215-1986 "Testing Methods for Durometer Hardness of Plastics" is preferably greater than or equal to 60, further is preferably greater than or equal to 65, and particularly is preferably greater than or equal to 70. Dimensional stability of the cured product improves and resistance to deformation of the cured product increases when hardness is greater than or equal to the lower limit of the aforementioned range. Although no particular limitation is placed on the bending strength of the cured product of the present composition, bending strength as specified by JIS K 6911-1995 "General Testing Methods of Thermosetting Plastics" is preferably greater than or equal to 5 MPa, further preferably is greater than or equal to 7 MPa, and particularly preferably is greater than or equal to 10 MPa. Mechanical strength of the cured product is good, and the cured product becomes resistant to cracking or the like, when bending strength is greater than or equal to the lower limit of the aforementioned range.

Although no particular limitation is placed on reflectance of the cured product of the present invention, total luminous reflectance as measured according to the method stipulated in JIS K 7375: 2008 "Plastics—Determination of Total Luminous Transmittance and Reflectance" is preferably greater than or equal to 80%, and particularly preferably is greater than or equal to 90%. Although no particular limitation is placed on the linear expansion coefficient of the cured product of the present composition, the linear expansion coefficient measured according to the method stipulated in JIS K 7197-1991 "Testing Method for Linear Thermal Expansion Coefficient of Plastics by Thermomechanical Analysis" in the temperature range of 25 to 200° C. has an average value that is preferably less than or equal to 200 ppm/° C., and particularly preferably is less than or equal to 150 ppm/° C.

Although the curing reaction of the present composition progresses at room temperature or due to heating, the composition of the present invention preferably is heated to cause rapid curing. Heating temperature is preferably in a range from 50 to 200° C., and further preferably is in a range from 100 to 150° C. The molding method of the present composition is exemplified by transfer molding, injection molding, and compression molding.

The cured product of the present composition displays good adhesion toward various types of substrates and is particularly characterized in that adhesion is high toward a metallic lead frame. This adhesion, measured as a die shear strength determined by die shear testing, for example, is preferably greater than or equal to 5 N/mm$^2$, and particularly preferably is greater than or equal to 8 N/mm$^2$.

The cured product of the present invention will be explained next in detail.

The cured product of the present invention is obtained by curing the aforementioned composition. The cured product of the present invention preferably has characteristics as described above.

The optical semiconductor device of the present invention will be explained next in detail.

The optical semiconductor device of the present invention is characterized by comprising: an optical semiconductor element, a lead frame for electrical connection to the element, and a light reflection material, contacting the lead frame, for reflection of light emitted from the element; wherein the light reflection material is formed by a cured product of the curable silicone composition. This type of optical semiconductor device is exemplified by a light emitting diode (LED). The material of the lead frame in this optical semiconductor device is exemplified by silver, nickel, aluminum, copper, silver-plated copper, or the like. Also, the light reflection material functions as a packaging material of the optical semiconductor device.

Figure 1:
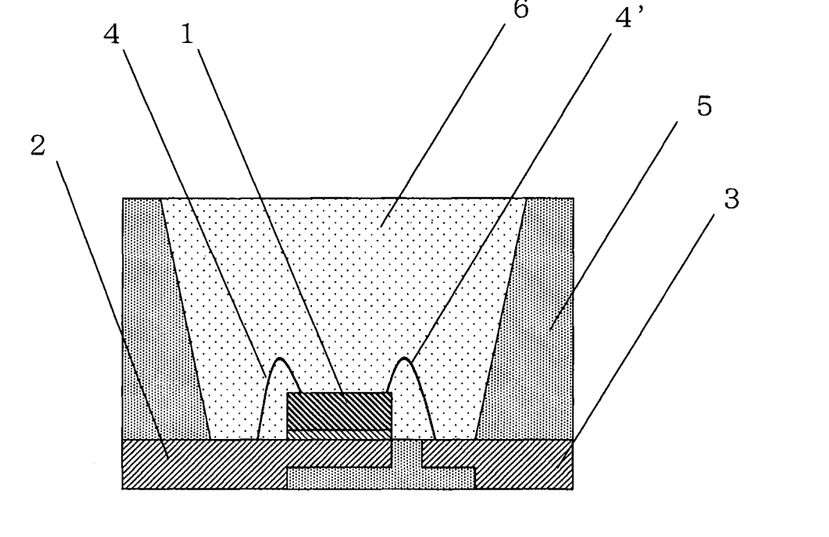
FIG. 1 is a cross-sectional view of an LED as one example of the optical semiconductor device of the present invention.

FIG. 1 shows a cross-sectional view of a surface mounted type LED, which is one example of the semiconductor device of the present invention. In the LED shown in FIG. 1, the optical semiconductor element 1 is die bonded to a lead frame 2 by a die bonding material, and lead frames 2,3 and this optical semiconductor element 1 are further wire bonded to the lead frame 2,3 by bonding wires 4,4'. At the periphery of this optical semiconductor element 1, with the exception of the upper part thereof, a light reflection material 5 composed of the cured product formed from the aforementioned curable silicone composition is present. The optical semiconductor element 1 within this light reflection material 5 is sealed by the sealing agent 6.

The method of production of the surface mounted type LED shown in FIG. 1 is exemplified by a method including the steps of: (1) forming a light reflection material 5 integrated with the lead frames 2,3 by compression molding or transfer molding of the curable silicone composition, (2) die bonding of the optical semiconductor element 1 on the lead frame 2 using a die bonding material, (3) wire bonding the optical semiconductor element 1 and the lead frames 2,3 using bonding wires 4,4', and (4) sealing the optical semiconductor element 1 using the sealing agent 6.

EXAMPLES

The curable silicone composition, cured product thereof, and optical semiconductor device of the present invention will be explained in further detail using practical examples. Viscosity values are values at 25° C. Moreover, in the formulae, "Me", "Ph", "Vi", and "Ep" respectively represent the methyl group, phenyl group, vinyl group, and 3-glycidoxypropyl group. Characteristics of the cured product were measured in the below described manner.

[Hardness]

Hardness of the cured product was measured by a type D durometer as specified in JIS K 7215-1986 "Testing Methods for Durometer Hardness of Plastics."

[Bending Strength]

Bending strength of the cured product was measured according to the method specified in JIS K 6911-1995 "General Testing Methods of Thermosetting Plastics."

[Total Luminous Reflectance]

Total luminous reflectance of the cured product was measured by the method specified in JIS K 7375:2008 "Plastics—Determination of Total Luminous Transmittance and Reflectance."

[Linear Expansion Coefficient]

Average linear expansion coefficient of the cured product in the temperature range of 25 to 200° C. was measured by the method specified in JIS K 7197-1991 "Testing Method for Linear Thermal Expansion Coefficient of Plastics by Thermomechanical Analysis."

[Die Shear Strength]

A dispenser was used to coat the curable silicone composition on a 25 mm×75 mm aluminum plate at 5 locations using roughly 100 mg at each location. A 1 mm thick and 6 mm square aluminum chip was placed on the composition, and the assembly was pressure bonded by a 1 kg plate. Thereafter, the assembly was heated for 2 hours at 150° C., and the curable silicone composition was cured. After the assembly was cooled to room temperature, die shear strength was measured using a shear strength measurement apparatus (Bond Tester SS-100KP, manufactured by Seishin Trading Co., Ltd.). Also, die shear strength of silver-plated steel chip toward silver-plated steel plate was measured in the above described manner.

Moreover, adhesion of the light reflection material to the lead frame of the optical semiconductor device was evaluated in the following manner.

[Adhesion to the Lead Frame]

By transfer molding the curable silicone composition, a case of an optical semiconductor device that had a light reflection material molded in an integrated manner to a silver-plated lead frame was produced. The bonded state of the light reflection material of this case to the lead frame was visually observed.

Practical Example 1

100 parts by mass of a methylvinylphenylpolysiloxane represented by the following average unit formula:

$(MeViSiO_{2/2})_{0.15}(Me_2SiO_{2/2})_{0.15}(Ph_2SiO_{2/2})_{0.30}$
$(PhSiO_{3/2})_{0.40}(HO_{1/2})_{0.04}$ 25 parts by mass of 1,3,5,7-tetramethyl-1,3,5,7-tetravinylcyclotetrasiloxane represented by the following formula:

$(MeViSiO)_4$ 2.0 parts by mass of an epoxy group-containing polysiloxane represented by the following average unit formula:

$(Me_2ViSiO_{1/2})_{0.2}(MeEpSiO_{2/2})_{0.25}(PhSiO_{3/2})_{0.55}$
$(HO_{1/2})_{0.005}$ 62 parts by mass of 1,1,5,5-tetramethyl-3,3-diphenyltrisiloxane represented by the following formula:

$(HMe_2SiO)_2SiPh_2$ in an amount that provides 1.0 mole of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 100 parts by mass of titanium oxide having an average primary particle diameter of 0.2 μm (SX-3103, manufactured by Sakai Chemical Industry Co., Ltd.), 135 parts by mass of crushed quartz powder having an average particle diameter of 5 μm (CRYSTALITE VX-52, manufactured by Tatsumori Ltd.), and 110 parts by mass of spherical silica having 15 μm average particle diameter (HS-202, manufactured by Nippon Steel & Sumikin Materials Co., Ltd.) were blended to prepare a curable silicone composition that had a viscosity of 38 Pa·s.

This composition was heated for 2 hours at 150° C. to form a cured product. This cured product had a type D durometer hardness of 76, a bending strength of 8.5 MPa, a total luminous reflectance of 94.5%, and a linear expansion coefficient of 118 ppm/° C. Die shear strength against an aluminum plate was 9.8 N/mm$^2$, and die shear strength against a silver-plated steel plate was 8.2 N/mm$^2$. A transfer molding machine and this composition were used to produce the optical semiconductor device shown in FIG. 1. A good molded product free of flashing, voids, and peeling was obtained by integrating molding with a lead frame at 120° C.

Practical Example 2

100 parts by mass of a methylvinylphenylpolysiloxane represented by the following average unit formula:

$$(MeViSiO_{2/2})_{0.25}(Ph_2SiO_{2/2})_{0.3}(PhSiO_{3/2})_{0.45}(HO_{1/2})_{0.4}$$

37.5 parts by mass of phenyltris(dimethylvinylsiloxy)silane represented by the following formula:

$$(ViMe_2SiO)_3SiPh$$

3.0 parts by mass of an epoxy group-containing polysiloxane represented by the following average unit formula:

$$(Me_3SiO_{1/2})_{0.2}(Me_2ViSiO_{1/2})_{0.2}(EpSiO_{3/2})_{0.2}(PhSiO_{3/2})_{0.4}(HO_{1/2})_{0.01}$$

87 parts by mass of 1,1,5,5-tetramethyl-3,3-diphenyltrisiloxane represented by the following formula:

$$(HMe_2SiO)_2SiPh_2$$

in an amount that provides 1.0 mole of silicon atom-bonded hydrogen atoms in the present component per 1 mole of the total amount of vinyl groups in the aforementioned methylvinylphenylpolysiloxane, phenyltris(dimethylvinylsiloxy)silane, and epoxy group-containing polysiloxane, 10 parts by mass of a silicon atom-bonded hydrogen atom-containing methylphenylpolysiloxane represented by the following average unit formula:

$$(Me_2HSiO_{1/2})_{0.6}(PhSiO_{3/2})_{0.4}$$

in an amount that provides 0.13 moles of silicon atom-bonded hydrogen atoms in the present component per 1 mole of the total amount of vinyl groups in the aforementioned methylvinylphenylpolysiloxane, phenyltris(dimethylvinylsiloxy)silane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 10.2 Pa·s.

This composition was heated for 2 hours at 150° C. to form a cured product. This cured product had a type D durometer hardness of 81, a bending strength of 20 MPa, a total luminous reflectance of 95.3%, and a linear expansion coefficient of 96 ppm/° C. Die shear strength against an aluminum plate was 14 N/mm$^2$, and die shear strength against a silver-plated steel plate was 12 N/mm$^2$. A transfer molding machine and this composition were used to produce the optical semiconductor device shown in FIG. 1.

A good molded product free of flashing, voids, and peeling was obtained by integrating molding with a lead frame at 120° C.

Practical Example 3

100 parts by mass of a methylvinylphenylpolysiloxane represented by the following average unit formula:

$$(MeViSiO_{2/2})_{0.10}(Me_2SiO_{2/2})_{0.15}(PhSiO_{3/2})_{0.75}(HO_{1/2})_{0.01}$$

37 parts by mass of tetrakis(dimethylvinylsiloxy)silane represented by the following formula:

$$Si(OSiMe_2Vi)_4$$

6.0 parts by mass of an epoxy group-containing polysiloxane represented by the following average unit formula:

$$(Me_2ViSiO_{1/2})_{0.2}(Ph_2SiO_{2/2})_{0.4}(EpSiO_{3/2})_{0.4}$$

87 parts by mass of 1,1,5,5-tetramethyl-3,3-diphenyltrisiloxane represented by the following formula:

$$(HMe_2SiO)_2SiPh_2$$

in an amount that provides 1.1 moles of silicon atom-bonded hydrogen atoms in the present component per 1 mole of the total amount of vinyl groups in the aforementioned methylvinylphenylpolysiloxane, tetrakis(dimethylvinylsiloxy)silane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 7.8 Pa·s.

This composition was heated for 2 hours at 150° C. to form a cured product. This cured product had a type D durometer hardness of 83, a bending strength of 17 MPa, a total luminous reflectance of 93.4%, and a linear expansion coefficient of 89 ppm/° C. Die shear strength against an aluminum plate was 13 N/mm$^2$, and die shear strength against a silver-plated steel plate was 11 N/mm$^2$. A transfer molding machine and this composition were used to produce the optical semiconductor device shown in FIG. 1. A good molded product free of flashing, voids, and peeling was obtained by integrating molding with a lead frame at 120° C.

Practical Example 4

100 parts by mass of a methylvinylphenylpolysiloxane represented by the following average unit formula:

$$(Me_2ViSiO_{1/2})_{0.20}(PhSiO_{3/2})_{0.80}(HO_{1/2})_{0.02}$$

8 parts by mass of 1,3,5,7-tetramethyl-1,3,5,7-tetravinylcyclotetrasiloxane represented by the following formula:

$$(MeViSiO)_4$$

20 parts by mass of a dimethylvinylsiloxy-terminated polymethylphenylsiloxane represented by the following formula:

ViMe$_2$SiO(MePhSiO)$_{17.5}$SiViMe$_2$ 5.0 parts by mass of an epoxy group-containing polysiloxane represented by the following average unit formula:

(Me$_2$ViSiO$_{1/2}$)$_{0.2}$(Ph$_2$SiO$_{2/2}$)$_{0.4}$(EpSiO$_{3/2}$)$_{0.4}$ 86.5 parts by mass of 1,1,5,5-tetramethyl-3,3-diphenyltrisiloxane represented by the following formula:

(HMe$_2$SiO)$_2$SiPh$_2$ in an amount that provides 0.78 moles of silicon atom-bonded hydrogen atoms in the present component per 1 mole of the total amount of vinyl groups in the aforementioned methylvinylphenylpolysiloxane, 1,3,5,7-tetramethyl-1,3,5,7- tetravinylcyclotetrasiloxane, dimethylvinylsiloxy-terminated polymethylphenylsiloxane, and epoxy group-containing polysiloxane, 7.5 parts by mass of a silicon atom-bonded hydrogen-containing methylphenylpolysiloxane represented by the following average unit formula:

(Me$_2$HSiO$_{1/2}$)$_{0.6}$(PhSiO$_{3/2}$)$_{0.4}$ in an amount that provides 0.17 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 180 parts by mass of spherical silica having 15 μm average particle diameter (HS-202, manufactured by Nippon Steel & Sumikin Materials Co., Ltd.) were blended to prepare a curable silicone composition that had a viscosity of 100 Pa·s.

This composition was heated for 2 hours at 150° C. to form a cured product. This cured product had a type D durometer hardness of 84, a bending strength of 19 MPa, a total luminous reflectance of 95.3%, and a linear expansion coefficient of 76 ppm/° C. Die shear strength against an aluminum plate was 12 N/mm$^2$, and die shear strength against a silver-plated steel plate was 10 N/mm$^2$. A transfer molding machine and this composition were used to produce the optical semiconductor device shown in FIG. 1. A good molded product free of flashing, voids, and peeling was obtained by integrating molding with a lead frame at 120° C.

Comparative Example 1

100 parts by mass of a methylvinylphenylpolysiloxane represented by the following average unit formula:

(MeViSiO$_{2/2}$)$_{0.15}$(Me$_2$SiO$_{2/2}$)$_{0.15}$(Ph$_2$SiO$_{2/2}$)$_{0.30}$(PhSiO$_{3/2}$)$_{0.40}$(HO$_{1/2}$)$_{0.04}$ 25 parts by mass of 1,3,5,7-tetramethyl-1,3,5,7-tetravinylcyclotetrasiloxane represented by the following formula:

(MeViSiO)$_4$ 56 parts by mass of 1,1,5,5-tetramethyl-3,3-diphenyltrisiloxane represented by the following formula:

(HMe$_2$SiO)$_2$SiPh$_2$ in an amount that provides 0.9 moles of silicon atom-bonded hydrogen atoms in this component per 1 mole of the total amount of vinyl groups in the aforementioned methylvinylphenylpolysiloxane and 1,3,5,7-tetramethyl-1,3,5,7-tetravinylcyclotetrasiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 100 parts by mass of titanium oxide having an average primary particle diameter of 0.2 μm (SX-3103, manufactured by Sakai Chemical Industry Co., Ltd.), 135 parts by mass of crushed quartz powder having an average particle diameter of 5 μm (CRYSTALITE VX-52, manufactured by Tatsumori Ltd.), and 110 parts by mass of spherical silica having 15 μm average particle diameter (HS-202, manufactured by Nippon Steel & Sumikin Materials Co., Ltd.) were blended to prepare a curable silicone composition that had a viscosity of 39 Pa·s.

This composition was heated for 2 hours at 150° C. to form a cured product. This cured product had a type D durometer hardness of 75, a bending strength of 7.0 MPa, a total luminous reflectance of 94.5%, and a linear expansion coefficient of 121 ppm/° C. Die shear strength against an aluminum plate was 3.4 N/mm$^2$, and die shear strength against a silver-plated steel plate was 2.2 N/mm$^2$. A transfer molding machine and this composition were used to produce the optical semiconductor device shown in FIG. 1. A molded product free of flashing and voids was obtained by integrating molding with a lead frame at 120° C., although peeling was observed at the contacting part of the lead frame and the light reflection material.

Comparative Example 2

100 parts by mass of a methylvinylphenylpolysiloxane represented by the following average unit formula:

(MeViSiO$_{2/2}$)$_{0.25}$(Ph$_2$SiO$_{2/2}$)$_{0.3}$(PhSiO$_{3/2}$)$_{0.45}$(HO$_{1/2}$)$_{0.04}$ 37.5 parts by mass of phenyltris(dimethylvinylsiloxy)silane represented by the following formula:

(ViMe$_2$SiO)$_3$SiPh 3.0 parts by mass of an epoxy group-containing polysiloxane represented by the following average unit formula:

(Me$_3$SiO$_{1/2}$)$_{0.2}$(Me$_2$ViSiO$_{1/2}$)$_{0.2}$(EpSiO$_{3/2}$)$_{0.2}$(PhSiO$_{3/2}$)$_{0.4}$(MeO$_{1/2}$)$_{0.3}$ 85 parts by mass of 1,1,5,5-tetramethyl-3,3-diphenyltrisiloxane represented by the following formula:

(HMe$_2$SiO)$_2$SiPh$_2$ in an amount that provides 1.0 mole of silicon atom-bonded hydrogen atoms in the present component per 1 mole of the total amount of vinyl groups in the aforementioned methylvinylphenylpolysiloxane, phenyltris(dimethylvinylsiloxy)silane, and epoxy group-containing polysiloxane, 10 parts by mass of a silicon atom-bonded hydrogen atom-containing methylphenylpolysiloxane represented by the following average unit formula:

(Me$_2$HSiO$_{1/2}$)$_{0.6}$(PhSiO$_{3/2}$)$_{0.4}$ in an amount that there is 0.1 moles of silicon atom-bonded hydrogen atoms in the present component relative to 1 mole of the total amount of vinyl groups in the aforementioned methylvinylphenylpolysiloxane, phenyltris(dimethylvinylsiloxy)silane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 9.8 Pa·s.

This composition was heated for 2 hours at 150° C. to form a cured product. This cured product had a type D durometer hardness of 80, a bending strength of 14 MPa, a total luminous reflectance of 95.2%, and a linear expansion coefficient of 98 ppm/° C. Die shear strength against an aluminum plate was 7.0 N/mm², and die shear strength against a silver-plated steel plate was 6.2 N/mm². A transfer molding machine and this composition were used to produce the optical semiconductor device shown in FIG. 1. A good molded product free of flashing, voids, and peeling was obtained by integrating molding with a lead frame at 120° C. However, after the composition was set aside for 24 hours at room temperature and molding was performed in the same manner, a molded product was obtained that had multiple voids in the light reflection material. Viscosity was checked and found to have risen to an extremely high value, i.e. greater than or equal to 250 Pa·s.

Comparative Example 3

100 parts by mass of a methylvinylphenylpolysiloxane represented by the following average unit formula:

37.5 parts by mass of tetrakis(dimethylvinylsiloxy)silane represented by the following formula:

92 parts by mass of 1,1,5,5-tetramethyl-3,3-diphenyltrisiloxane represented by the following formula:

in an amount that provides 1.1 moles of silicon atom-bonded hydrogen atoms in the present component per 1 mole of the total amount of vinyl groups in the aforementioned methylvinylphenylpolysiloxane, tetrakis(dimethylvinylsiloxy)silane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 3.5 ppm of the platinum metal in terms of mass units in the present composition, 1-ethynyl-1-cyclohexanol in an amount that provides 200 ppm in terms of mass units in the present composition, 80 parts by mass of titanium oxide having an average primary particle diameter of 0.24 μm (TIPAQUE R-630, manufactured by Ishihara Sangyo Kaisha Ltd.), 65 parts by mass of crushed quartz powder having an average particle diameter of 5 μm (MIN-U-SIL #5, manufactured by Hayashi Kasei Co., Ltd.), and 135 parts by mass of spherical silica having 30 μm average particle diameter (FB-570, manufactured by Denki Kagaku Kogyo K.K.) were blended to prepare a curable silicone composition that had a viscosity of 9.4 Pa·s.

This composition was heated for 2 hours at 150° C. to form a cured product. This cured product had a type D durometer hardness of 82, a bending strength of 16 MPa, a total luminous reflectance of 93.3%, and a linear expansion coefficient of 85 ppm/° C. Die shear strength against an aluminum plate was 3.3 N/mm², and die shear strength against a silver-plated steel plate was 1.0 N/mm². A transfer molding machine and this composition were used to produce the optical semiconductor device shown in FIG. 1. A molded product free of flashing and voids was obtained by integrating molding with a lead frame at 120° C., although peeling was observed at the contacting part of the lead frame and the light reflection material.

Comparative Example 4

100 parts by mass of a methylvinylphenylpolysiloxane represented by the following average unit formula:

8 parts by mass of 1,3,5,7-tetramethyl-1,3,5,7-tetravinylcyclotetrasiloxane represented by the following formula:

20 parts by mass of a dimethylvinylsiloxy-terminated polymethylphenylsiloxane represented by the following formula:

0.5 parts by mass of an epoxy group-containing polysiloxane represented by the following average unit formula:

35 parts by mass of 1,1,5,5-tetramethyl-3,3-diphenyltrisiloxane represented by the following formula:

in an amount that provides 0.77 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, dimethylvinylsiloxy-terminated polymethylphenylsiloxane, and epoxy group-containing polysiloxane, 7.5 parts by mass of a silicon atom-bonded hydrogen-containing methylphenylpolysiloxane represented by the following average unit formula:

in an amount that provides 0.18 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 250 parts by mass of spherical silica having 15 μm average particle diameter (HS-202, manufactured by Nippon Steel & Sumikin Materials Co., Ltd.) were blended to prepare a curable silicone composition that had a viscosity of 100 Pa·s.

This composition was heated for 2 hours at 150° C. to form a cured product. This cured product had a type D durometer hardness of 84, a bending strength of 19 MPa, a total luminous reflectance of 95.3%, and a linear expansion coefficient of 76 ppm/° C. Die shear strength against an aluminum plate was 5.0 N/mm², and die shear strength against a silver-plated steel plate was 2.9 N/mm². A transfer molding machine and this composition were used to produce the optical semiconductor device shown in FIG. 1. A good molded product free of flashing, voids, and peeling was obtained by integrating molding with a lead frame at 120° C. However, peeling was observed at the contacting part between the lead frame and light reflection material.

Comparative Example 5

100 parts by mass of a methylvinylphenylpolysiloxane represented by the following average unit formula:

(Me$_2$ViSiO$_{1/2}$)$_{0.20}$(PhSiO$_{3/2}$)$_{0.80}$(HO$_{1/2}$)$_{0.02}$ 8 parts by mass of 1,3,5,7-tetramethyl-1,3,5,7-tetravinylcyclotetrasiloxane represented by the following formula:

(MeViSiO)$_4$ 20 parts by mass of a dimethylvinylsiloxy-terminated polymethylphenylsiloxane represented by the following formula:

ViMe$_2$SiO(MePhSiO)$_{17.5}$SiViMe$_2$ 12 parts by mass of an epoxy group-containing polysiloxane represented by the following average unit formula:

(Me$_2$ViSiO$_{1/2}$)$_{0.2}$(Me$_2$SiO$_{2/2}$)$_{0.4}$(EpSiO$_{3/2}$)$_{0.4}$ 38 parts by mass of 1,1,5,5-tetramethyl-3,3-diphenyltrisiloxane represented by the following formula:

(HMe$_2$SiO)$_2$SiPh$_2$ in an amount that provides 0.78 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, dimethylvinylsiloxy-terminated polymethylphenylsiloxane, and epoxy group-containing polysiloxane, 8 parts by mass of a silicon atom-bonded hydrogen-containing methylphenylpolysiloxane represented by the following average unit formula:

(Me$_2$HSiO$_{1/2}$)$_{0.6}$(PhSiO$_{3/2}$)$_{0.4}$ in an amount that provides 0.18 moles of silicon atom-bonded hydrogen atoms in the present component per 1 mole of the total amount of vinyl groups in the aforementioned methylvinylphenylpolysiloxane, 1,3,5,7-tetramethyl-1,3,5,7-tetravinylcyclotetrasiloxane, and dimethylvinylsiloxy-terminated polymethylphenylsiloxane, and epoxy group-containing polysiloxane, 1,3-divinyl-1,1,3,3-tetramethyldisiloxane solution of 1,3-divinyl-1,1,3,3-tetramethyldisiloxane complex of platinum in an amount that provides 5 ppm of the platinum metal in terms of mass units in the present composition, 1-ethynyl-1-cyclohexanol in an amount that provides 250 ppm in terms of mass units in the present composition, 110 parts by mass of titanium oxide having an average primary particle diameter of 0.2 μm (SX-3103, manufactured by Sakai Chemical Industry Co., Ltd.), 100 parts by mass of crushed quartz powder having an average particle diameter of 5 μm (SILICIC SAB-500, manufactured by Yamamori Tsuchimoto Mining Co., Ltd.), and 250 parts by mass of spherical silica having 15 μm average particle diameter (HS-202, manufactured by Nippon Steel & Sumikin Materials Co., Ltd.) were blended to prepare a curable silicone composition that had a viscosity of 86 Pa·s.

This composition was heated for 2 hours at 150° C. to form a cured product. This cured product had a type D durometer hardness of 83, a bending strength of 16 MPa, a total luminous reflectance of 95.2%, and a linear expansion coefficient of 78 ppm/° C. Die shear strength against an aluminum plate was 6.5 N/mm², and die shear strength against a silver-plated steel plate was 4.1 N/mm². A transfer molding machine and this composition were used to produce the optical semiconductor device shown in FIG. 1. A good molded product free of flashing, voids, and peeling was obtained by integrating molding with a lead frame at 120° C. However, peeling was observed at the contacting part between the lead frame and light reflection material.

Industrial Applicability

The curable silicone composition of the present invention has good formability, and the cured product has good adhesion to the metal used in a lead frame. Thus, the curable silicone composition of the present invention is suitable as a material for a white case material of a light emitting diode.

Description Of Symbols 1 optical semiconductor element
2 lead frame
3 lead frame
4, 4' bonding wire
5 light reflection material composed of cured silicone
6 sealing agent

The invention claimed is:

1. A curable silicone composition comprising:
(A) 100 parts by mass of an organopolysiloxane represented by the following average unit formula:

(R$^1_3$SiO$_{1/2}$)$_a$(R$^1_2$SiO$_{2/2}$)$_b$(R$^1$SiO$_{3/2}$)$_c$(SiO$_{4/2}$)$_d$
(R$^2$O$_{1/2}$)$_e$ wherein R$^1$ are independently the same or different, and are phenyl groups, alkyl groups having from 1 to 6 carbons, or alkenyl groups having from 2 to 6 carbons, provided that 30 to 80 mole% of all R$^1$ are phenyl groups, and 5 to 20 mole% of all R$^1$ are alkenyl groups; R$^2$ is a hydrogen atom or alkyl group having from 1 to 6 carbons; and a, b, c, d, and e are numbers that respectively satisfy: 0≤a≤0.3, 0≤b≤0.7, 0.3≤c≤0.9, 0≤d≤0.1, 0≤e≤0.1, and a+b+c+d=1;

(B) 5 to 50 parts by mass of an organopolysiloxane having 10 or less silicon atoms and not having a glycidoxyalkyl group or epoxycyclohexyl alkyl group, wherein 30 to 60 mole% of all silicon atom-bonded organic groups in the (B) component are alkenyl groups having from 2 to 6 carbons;

(C) 0 to 40 parts by mass of an organopolysiloxane represented by the following general formula:

R$^3_3$SiO(R$^3_2$SiO)$_m$SiR$^3_3$ wherein R$^3$ are independently the same or different, and are phenyl groups, alkyl groups having from 1 to 6 carbons, or alkenyl groups having from 2 to 6 carbons, provided that 30 to 70 mole% of all R$^3$ are phenyl groups, and at least one R$^3$ is an alkenyl group; and m is an integer in a range from 10 to 100;

(D) an organopolysiloxane having at least 2 silicon atom-bonded hydrogen atoms in a molecule, wherein 20 to 70 mole% of all silicon atom-bonded organic groups in this component are phenyl groups, in an amount that provides 0.5 to 2.0 moles of silicon atom-bonded hydrogen atoms in the (D) component per 1 mole of the total amount of alkenyl groups in components (A) to (C) and component (E);

(E) an organopolysiloxane represented by the following average unit formula:

$(R^4_3SiO_{1/2})_f(R^4_2SiO_{2/2})_g(R^4SiO_{3/2})_h(SiO_{4/2})_i(R^5O_{1/2})_j$ wherein $R^4$ are independently the same or different, and are phenyl groups, alkyl groups having from 1 to 6 carbons, alkenyl groups having from 2 to 6 carbons, glycidoxyalkyl groups, or epoxycyclohexyl alkyl groups, provided that 15 to 60 mole% of all $R^4$ are phenyl groups, 3 to 30 mole% of all $R^4$ are alkenyl groups, and 5 to 30 mole% of all $R^4$ are glycidoxyalkyl groups or epoxycyclohexyl alkyl groups; $R^5$ is a hydrogen atom or an alkyl group having from 1 to 6 carbons; and f, g, h, i, and j are numbers that respectively satisfy: $0 \le f \le 0.5$, $0 \le g \le 0.9$, $0 \le h \le 0.7$, $0 \le i \le 0.3$, $0 \le j \le 0.02$, and $f+g+h+i=1$, in an amount of 0.5 to 5.0 parts by mass per 100 parts by mass of the total amount of components (A) to (D);

(F) a hydrosilylation reaction catalyst in an amount sufficient to accelerate a hydrosilylation reaction between the alkenyl groups in components (A) to (C) and component (E) and the silicon atom-bonded hydrogen atoms in component (D);

(G) a white pigment in an amount of at least 25 parts by mass per 100 parts by mass of the total amount of components (A) to (F); and (H) an inorganic filler other than a white pigment in an amount of at least 40 parts by mass per 100 parts by mass of the total amount of components (A) to (F), wherein the content of the total amount of components (G) and (H) is not more than 300 parts by mass per 100 parts by mass of the total amount of components (A) to (F).

2. The curable silicone composition according to claim 1, wherein a viscosity at 25° C. is from 5 to 200 Pa·s.

3. The curable silicone composition according to claim 1, wherein the curable silicone composition cures to form a cured product having a type D durometer hardness greater than or equal to 60, and a bending strength greater than or equal to 5 MPa.

4. The curable silicone composition according to claim 1, wherein the curable silicone composition cures to form a cured product having a total luminous reflectance greater than or equal to 80%.

5. The curable silicone composition according to claim 1, wherein the curable silicone composition cures to form a cured product having an average coefficient of linear expansion in a temperature range of 25 to 200° C. less than or equal to 200 ppm/° C.

6. A cured product produced by curing the curable silicone composition according to claim 1.

7. An optical semiconductor device comprising: an optical semiconductor element; a lead frame for electrical connection to the element; and a light reflection material that contacts the lead frame for reflection of light emitted from the element, wherein the light reflection material is formed by a cured product of the curable silicone composition according to claim 1.

* * * * *